United States Patent
Thie et al.

(10) Patent No.: US 7,829,152 B2
(45) Date of Patent: Nov. 9, 2010

(54) ELECTROLESS PLATING METHOD AND APPARATUS

(75) Inventors: William Thie, Mountain View, CA (US); John M. Boyd, Hillsboro, CA (US); Yezdi Dordi, Palo Alto, CA (US); Fritz C. Redeker, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 1057 days.

(21) Appl. No.: 11/539,155

(22) Filed: Oct. 5, 2006

(65) Prior Publication Data

US 2008/0085370 A1    Apr. 10, 2008

(51) Int. Cl.
C23C 18/32 (2006.01)
C23C 18/50 (2006.01)
B05D 1/18 (2006.01)
B05D 3/02 (2006.01)
H01L 21/441 (2006.01)
H01L 21/445 (2006.01)

(52) U.S. Cl. ................ 427/443.1; 427/314; 438/678

(58) Field of Classification Search ............... 427/443.1
See application file for complete search history.

(56) References Cited

U.S. PATENT DOCUMENTS

| | | | |
|---|---|---|---|
| 5,534,073 A | | 7/1996 | Kinoshita et al. |
| 5,830,805 A | * | 11/1998 | Shacham-Diamand et al. ... 438/678 |
| 5,960,159 A | | 9/1999 | Ikeda et al. |
| 2003/0029570 A1 | | 2/2003 | Kawamura et al. |
| 2004/0052963 A1 | * | 3/2004 | Ivanov et al. ............ 427/443.1 |
| 2005/0022745 A1 | * | 2/2005 | Nakano et al. ............ 118/728 |
| 2005/0084615 A1 | * | 4/2005 | Weidman et al. ............ 427/305 |

* cited by examiner

*Primary Examiner*—Katherine A Bareford
(74) *Attorney, Agent, or Firm*—Martine Penilla & Gencarella, LLP

(57) ABSTRACT

An electroless plating system is provided. The system includes a first vacuum chuck supporting a first wafer and a second vacuum chuck supporting a second wafer such that a top surface of the second wafer is opposing a top surface of the first wafer. The system also includes a fluid delivery system configured to deliver a plating solution to the top surface of the first wafer, wherein in response to delivery of the plating solution, the top surface of the second wafer is brought proximate to the top surface of the first wafer so that the plating solution contacts both top surfaces. A method for applying an electroless plating solution to a substrate is also provided.

8 Claims, 7 Drawing Sheets

ELECTROLESS PLATING METHOD AND APPARATUS

BACKGROUND

Electroless plating requires stringent control of the reaction chamber environment and the plating solution. Current electroless plating systems either dispense electrolyte on a spinning wafer or immerse the wafer in a bath of the electrolyte fluid. With these systems, control of the electrolyte over time is difficult. With a spinning wafer, a fair amount of fluid is lost as the wafer spins. With the bath system, the entire bath must be dumped and replaced periodically. Thus, in either of these cases relatively large volumes of the electrolyte solution are consumed for the processing as compared to the amount actually used for the electroless plating. This results in significant waste, not to mention the control issues centered around the chemical bath system. In addition, the attention required for the control of the plating solution and the need to dump and replace the chemical bath cuts into the throughput.

Another drawback with the current systems is that the plating bath must be maintained at an elevated plating temperature. This elevated temperature leads to the degradation of certain additives, e.g., reducing agents, especially with respect to electroless plating techniques that deposit cobalt layers.

In view of the forgoing, there is a need for an electroless plating method and system that can achieve a high throughput with minimal waste.

SUMMARY

Broadly speaking, the present invention fills these needs by providing a method and apparatus for electroless plating of a substrate using a minimal volume of plating solution and without impacting throughput. It should be appreciated that the present invention can be implemented in numerous ways, including as an apparatus, a method and a system. Several inventive embodiments of the present invention are described below.

In one embodiment, an electroless plating system is provided. The system includes a first vacuum chuck supporting a first wafer and a second vacuum chuck supporting a second wafer such that a top surface of the second wafer is opposing a top surface of the first wafer. The system also includes a fluid delivery system configured to deliver a plating solution to the top surface of the first wafer, wherein in response to delivery of the plating solution, the top surface of the second wafer is brought proximate to the top surface of the first wafer so that the plating solution contacts both top surfaces.

In another embodiment, an electroless plating system for depositing a layer onto a substrate is provided. The system includes a first vacuum chuck supporting a first wafer and a second vacuum chuck supporting a second wafer. A top surface of the second wafer is opposing a top surface of the first wafer, and the first and second vacuum chucks are capable of heating corresponding wafers. The second vacuum chuck heats the second wafer to a temperature above a temperature that induces a plating reaction. The system further includes a fluid delivery system configured to deliver a plating solution to the top surface of the first wafer. In response to delivery of the plating solution, the top surface of the second wafer is brought proximate to the top surface of the first wafer through a drive mechanism coupled to one of the first or the second vacuum chuck so that the plating solution contacts both top surfaces of the wafers.

In still another embodiment, a method for electroless plating on a semiconductor substrate is provided. The method initiates with loading first and second semiconductor substrates onto corresponding first and second support structures. The method includes orienting first and second support structures so that corresponding exposed semiconductor substrate surfaces are opposing each other and applying a plating solution to an exposed surface of the first semiconductor substrate. The method also includes bringing an exposed surface of the second semiconductor substrate into contact with the plating solution on the exposed surface of the first semiconductor substrate and initiating a plating reaction between the plating solution and both exposed surfaces. The exposed surfaces are then moved away from each other.

Other aspects of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION

Figure 1:
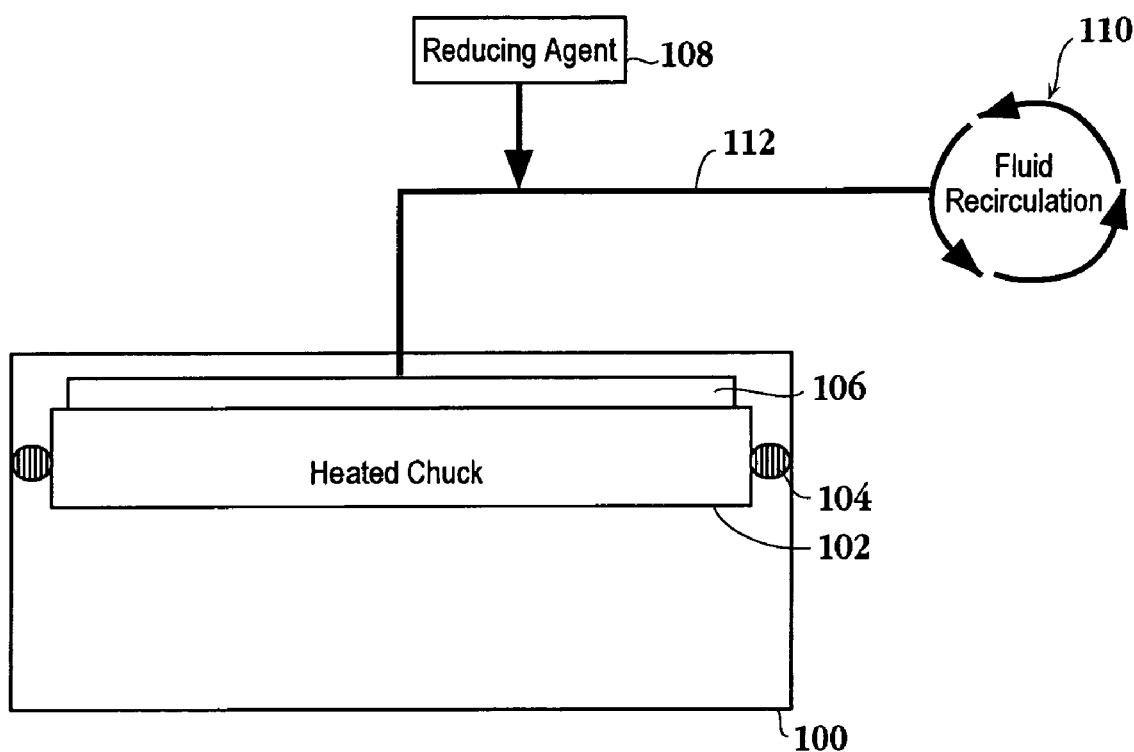
FIG. 1 is a simplified schematic diagram illustrating a point of use application for an electroless plating technique in accordance with one embodiment of the invention.

An invention is described for a high throughput electroless plating system. It should be appreciated that while specific plating solutions are described herein, the chamber may be used for any plating solution and is not limited for use with the specifically mentioned plating solutions. It will be obvious, however, to one skilled in the art, that the present invention may be practiced without some or all of these specific details. In other instances, well known process operations have not been described in detail in order not to unnecessarily obscure the present invention.

Electroless plating of cobalt on substrates requires precise control of both the reaction chamber environment and the electrolyte chemistry or solution. Current electroless plating systems utilize a recirculating chemistry bath that either dispenses electrolyte on a spinning wafer, or allows a wafer to be immersed in the bath itself. In either case, control of the electrolyte temperature over time is difficult. Current techniques utilize systems which tend to not use all of the available reactants in the solution prior to disposal, and hence waste the electrolyte chemistry. Thus, the costs involved increase because of the costliness of the electrolyte chemistry. In addition, the plating process requires the plating temperature to be maintained at an elevated temperature for the reaction to take place, which also leads to a degradation of key additives within the electrolyte solution, such as the reducing agent used in the cobalt electroless plating chemistry.

The embodiments described herein enable a minimal volume use of electrolyte per wafer, point of use mixing of key components of the electrolyte chemistry, low temperature storage and delivery of the plating chemical components, and increased throughput. As will be described in more detail below, the wafers are loaded on corresponding heated vacuum chucks, in a manner such that the surfaces of the wafer to have the plating solution applied are facing each other. That is, one wafer exposed surface is facing down over another wafer exposed surface facing up. Fluid is then dispensed on the face-up wafer prior to the wafer reaching the plating temperature. That is, the wafer is heated to a temperature below a temperature inducing a plating reaction. In the case of a cobalt electroless plating solution, this temperature is below about 45 degrees C. It should be appreciated that the fluid dispensed is the electrolyte chemistry for the electroless plating. Once the fluid has been dispensed onto the face-up wafer, the wafers are moved together to form a narrow gap between the two opposing surfaces of the wafers. This forces the dispensed fluid to fill the gap before the wafers reach the threshold plating temperature. In one exemplary embodiment, a gap of less than 100 micrometers is used and the volume of fluid required to fill this gap between the two wafers is less than 10 millimeters. In another embodiment, to improve liquid distribution within the gap and to minimize bubble formation, the heated vacuum chucks may be machined to have a slight convex curvature that enables full coverage of both wafer surfaces by the electrolyte after gap formation. The electroless plating solution may be any suitable multi-component commercially available formulation, such as those provided by Enthone Inc. of West Haven, Conn. The process of applying plating solution to the exposed surface of the first semiconductor substrate can include delivering an amount of plating solution between about 2 mL and about 5 mL, where the plating solution is a cobalt based plating solution. The process can also include rinsing the exposed surfaces and drying the rinsed surfaces.

FIG. 1 is a simplified schematic diagram illustrating a point of use application for an electroless plating technique in accordance with one embodiment of the invention. Chamber 100 includes heated chuck 102 on top of which wafer or substrate 106 rests. O-rings 104 are used to seal the bottom area of chamber 100 from any electrolyte fluids falling off of the wafer 106 surface. Additionally, the volume of fluid dispensed can be chosen to be only slightly more than the volume subtended by the wafer diameter and gap formed, to minimize overflow. Fluid recirculation loop 110 will recirculate an electrolyte fluid without the reducing agent. In one embodiment, fluid recirculation loop 110 is maintained at an elevated temperature. This elevated temperature may be above about 45 degrees C. in another exemplary embodiment and between about 50 degrees C. and about 60 degrees C. in one exemplary embodiment. Fluid recirculation loop 110 feeds into delivery line 112, which ultimately delivers the fluid to a top surface of wafer 106. Reducing agent 108 is added into delivery line 112 at a point of use downstream from fluid recirculation loop 110. It should be appreciated that as reducing agent 108 is a major cause of the instability of the electrolyte solution, adding the reducing agent at a point of use will help stabilize the process. In addition, as the amount of reducing agent to be added to the electrolyte solution through delivery line 112, is relatively small, the dilution will not affect any temperature of the fluid if the fluid recirculation loop is held at an elevated temperature. The electrolyte fluid, including reducing agent 108, is delivered to a top surface of wafer 106 and the electroless plating reaction takes place to dispose a film over a top surface of wafer 106. In one embodiment, the film is a cobalt-based film. In this embodiment, the portion of the plating solution recirculated in the recirculation loop may be composed of 0.1 M cobalt chloride or sulfate, 0.2 M sodium hypophosphite, 0.03 M sodium tungstate, 0.5 M sodium citrate, 0.5 M boric acid, and a small amount of a surfactant The portion of the plating solution added at the point of use is a reducing agent such as dimethylamine borane (DMAB). One skilled in the art should appreciate that other plating solutions, e.g., those provided by Enthone Inc. may be incorporated with the embodiments described herein as the above listed solution composition is exemplary and not meant to be limiting.

FIGS. 2A through 2D illustrate an electroless plating solution technique in which throughput is increased and a volume of electrolyte fluid consumed is minimized in accordance with one embodiment of the invention. Vacuum chuck A 120 supports wafer A 124. Vacuum chuck B 122 supports wafer B 126. In one embodiment, vacuum chuck A 120 and vacuum chuck B 122 may be loaded with corresponding wafers while each vacuum chuck is in an upright position. Thereafter, vacuum chuck A may be inverted and disposed over vacuum chuck B so that surfaces of wafer A 124 and wafer B 126 are opposing each other. It will be apparent to one skilled in the art that any suitable vacuum chuck may be used to support the corresponding wafers. Furthermore, the structure for inverting the vacuum chuck may be a driven support arm coupled to the vacuum chuck, which is capable of inverting and moving the vacuum chuck in a horizontal and vertical position. One skilled in the art will appreciate that a motor coupled to the support arm may provide the required movement to invert the vacuum chuck and provide the vertical and the horizontal translation. In one embodiment, each vacuum chuck may be coupled to a support arm and both vacuum chucks are moveable. Alternatively, one of the vacuum chucks may be moveable.

Figure 2A:
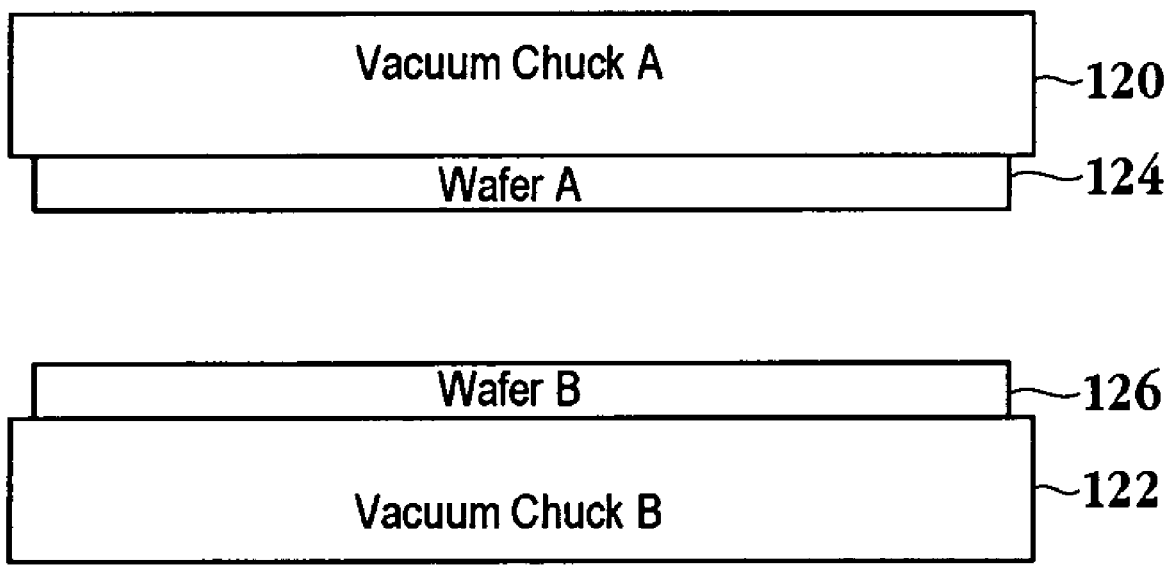
FIGS. 2A through 2D illustrate an electroless plating solution technique in which throughput is increased and a volume of electrolyte fluid consumed is minimized in accordance with one embodiment of the invention.
Figure 2B:
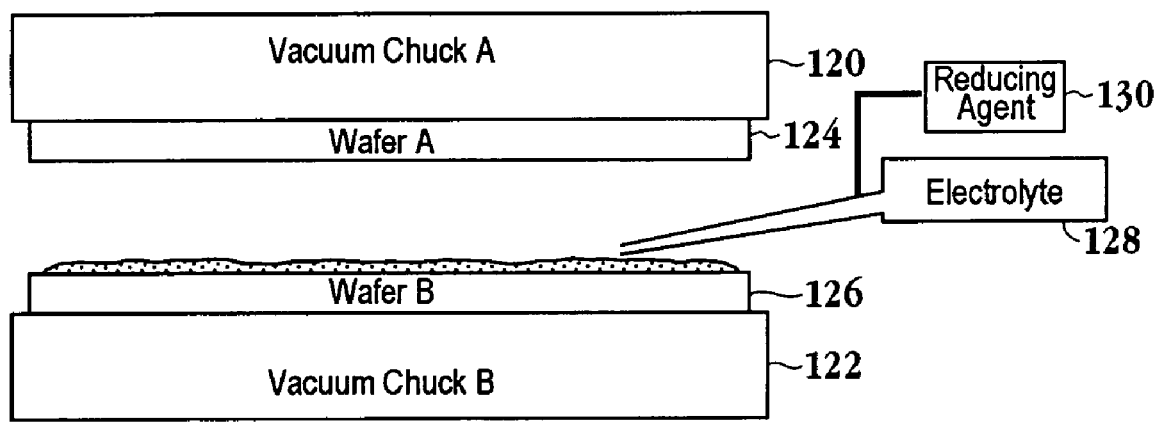

In addition, vacuum chuck A 120 and vacuum chuck B 122 are capable of applying heat to the corresponding wafers supported by the vacuum chucks. One skilled in the art will appreciate that heat may be applied to the wafer through known available techniques, e.g., resistance heating, or other known techniques. FIG. 2B illustrates an electrolyte fluid being applied to a top surface of wafer B 126 which is supported on vacuum chuck B 122. As mentioned above, the temperature of wafer B 126 is heated to a point that is below the temperature inducing the reaction to cause the electroless plating. Thus, the electroless plating will not take place upon the disposition of the electrolyte fluid on the top surface of wafer B 126. In addition, electrolyte 128 is maintained at room temperature as a small volume is only necessary to be applied to the top surface of wafer B 126. As illustrated, reducing agent 130 is added at a point of use into the delivery line providing the electrolyte solution to the top surface of wafer B 126. Of course, the reducing agent 130 may be incorporated into the reservoir holding electrolyte 128. In this embodiment, the temperature may be further reduced to safeguard against degradation of the electrolyte. It should be appreciated that since a relatively small amount of electrolyte is needed for the embodiments described herein, the temperature of the electrolyte fluid has a negligible impact on the temperature as the wafers are pre-heated.

Figure 2C:
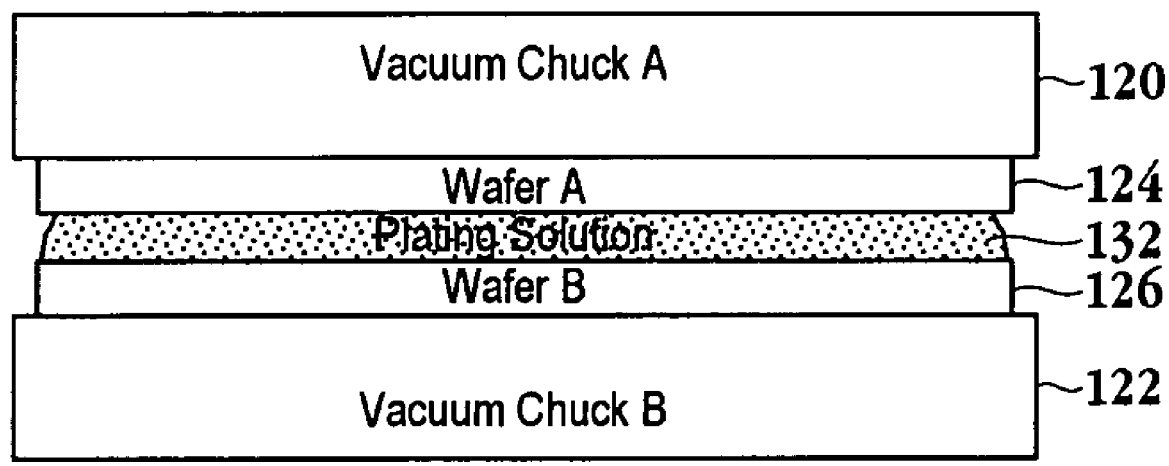
Figure 2D:
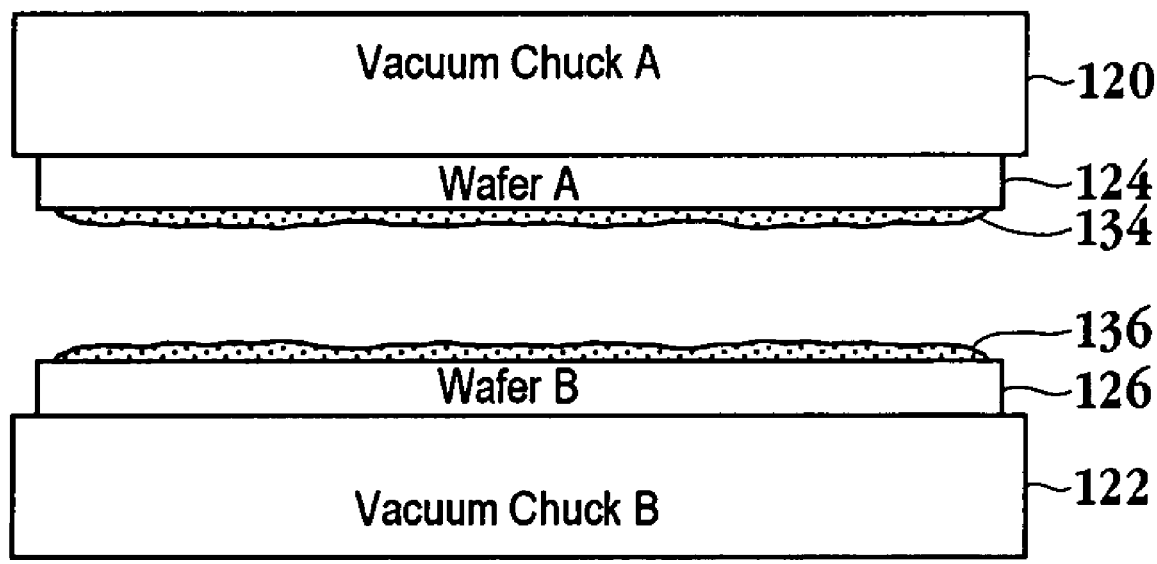

FIG. 2C illustrates the removal of the fluid delivery structure and the lowering of vacuum chuck A to define a small gap between the corresponding surfaces of wafer A 124 and wafer B 126. Alternatively, vacuum chuck B and vacuum chuck A may both move towards each other. As the gap between wafer A and wafer B is reduced, both surfaces, i.e., the top surface of wafer A 124 and the top surface of wafer B 126, are in contact with the plating solution. Gap 132 contains the plating solution therein and the gap may be less than 100 micrometers in one embodiment of the invention. The gap, in one embodiment, can be between about 50 micrometers and about 1000 micrometers. Thus, a thin meniscus is formed between the corresponding surfaces of wafer A 124 and wafer B 126. The amount of liquid utilized to form this meniscus in gap 132 may be two milliliters on a 200 millimeter wafer or 4-5 milliliters on a 300 millimeter wafer in accordance with one embodiment of the invention. These amounts will typically provide a film of less than one millimeter on the corresponding wafer surfaces. In one embodiment, the reaction may be self-limiting. That is, the fluid may be consumed during the entire reaction period so that no electrolyte fluid is wasted. In other words, the entire amount of cobalt is deposited on the surfaces and the remaining fluid upon completion of the reaction, i.e., the depletion layer, is waste to be discarded. It should be appreciated that as the temperature of both the plating solution and wafer B was below the reaction temperature, wafer A was held at a temperature above the reaction temperature when brought into contact with the plating solution in accordance with one embodiment of the invention. The plating solution is then heated through both vacuum chuck A 120 and vacuum chuck B 122, through corresponding wafers in order to uniformly plate the corresponding wafers. FIG. 2D illustrates the separation of corresponding vacuum chucks 120 and 122. Here again, one skilled in the art will appreciate that known mechanical structures and techniques may achieve this separation. After the reaction has completed, vacuum chuck A 120 and vacuum chuck B 122 are separated and wafer A 124 has a film 134 defined thereon. Similarly, wafer B 126 has a film 136 disposed thereon. Upon separation of the corresponding wafers, the surfaces that have the films may be rinsed, or quenched, through a fine spray or dumped into a water bath in one embodiment of the invention. The wafers may then be moved for further processing as desired.

Figure 3:
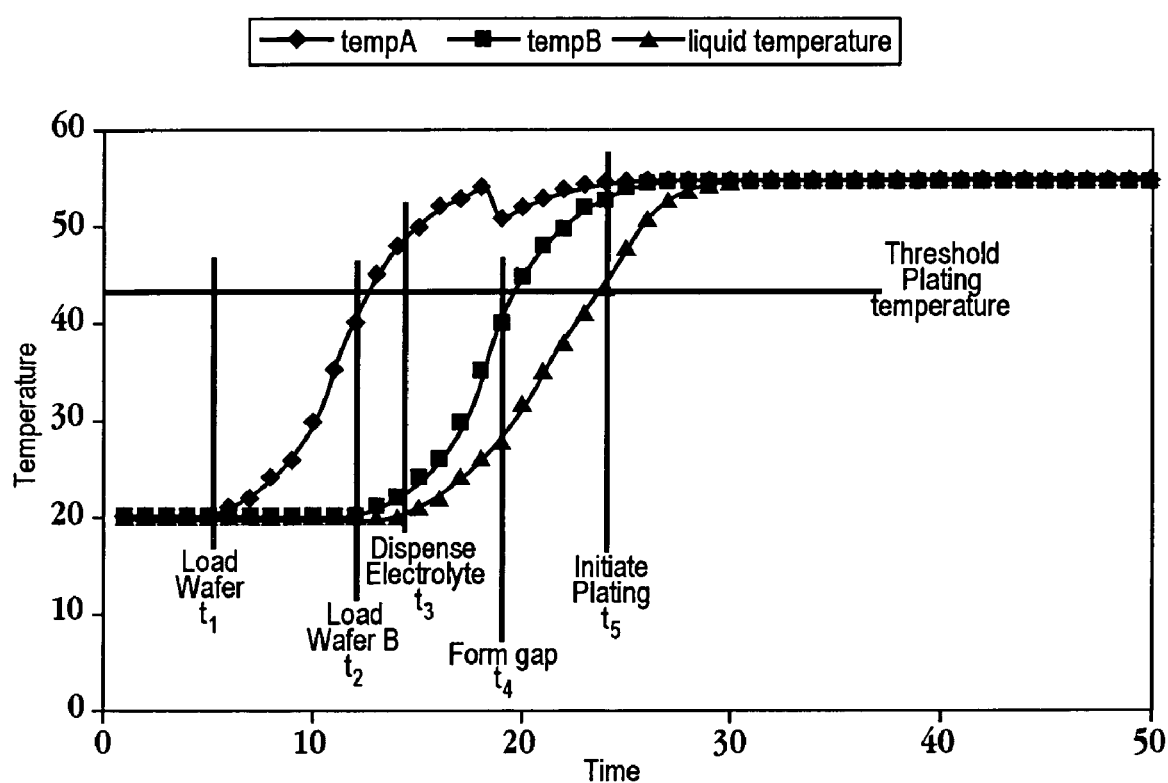
FIG. 3 is a graph illustrating the electroless plating process in terms of temperature and time in accordance with one embodiment of the invention.

FIG. 3 is a graph illustrating the electroless plating process in terms of temperature and time in accordance with one embodiment of the invention. As illustrated in FIG. 3, at time T1 wafer A, which is the top wafer is loaded onto a corresponding vacuum chuck. At time T2 wafer B is loaded onto its corresponding vacuum chuck. Here, wafer B is the bottom wafer. At time T3, the electrolyte solution is dispensed on top of the top surface of wafer B. As illustrated at time T3, wafer A has reached the reaction plating temperature, i.e., about 45 degrees C. for a cobalt plating process, however, wafer B is not yet at the plating temperature. At time T4, wafer A is brought down to form the meniscus in the small gap between the two corresponding wafers. Here again, wafer B has not yet reached the reaction temperature but is approaching that temperature and through the coupling of wafer B and wafer A through the meniscus, the reaction temperature is achieved efficiently. The plating is initiated at time T5 as the corresponding temperatures have equilibrated and are above the plating temperature. Once the plating reaction completes, the wafers are separated for further processing.

Figure 4:
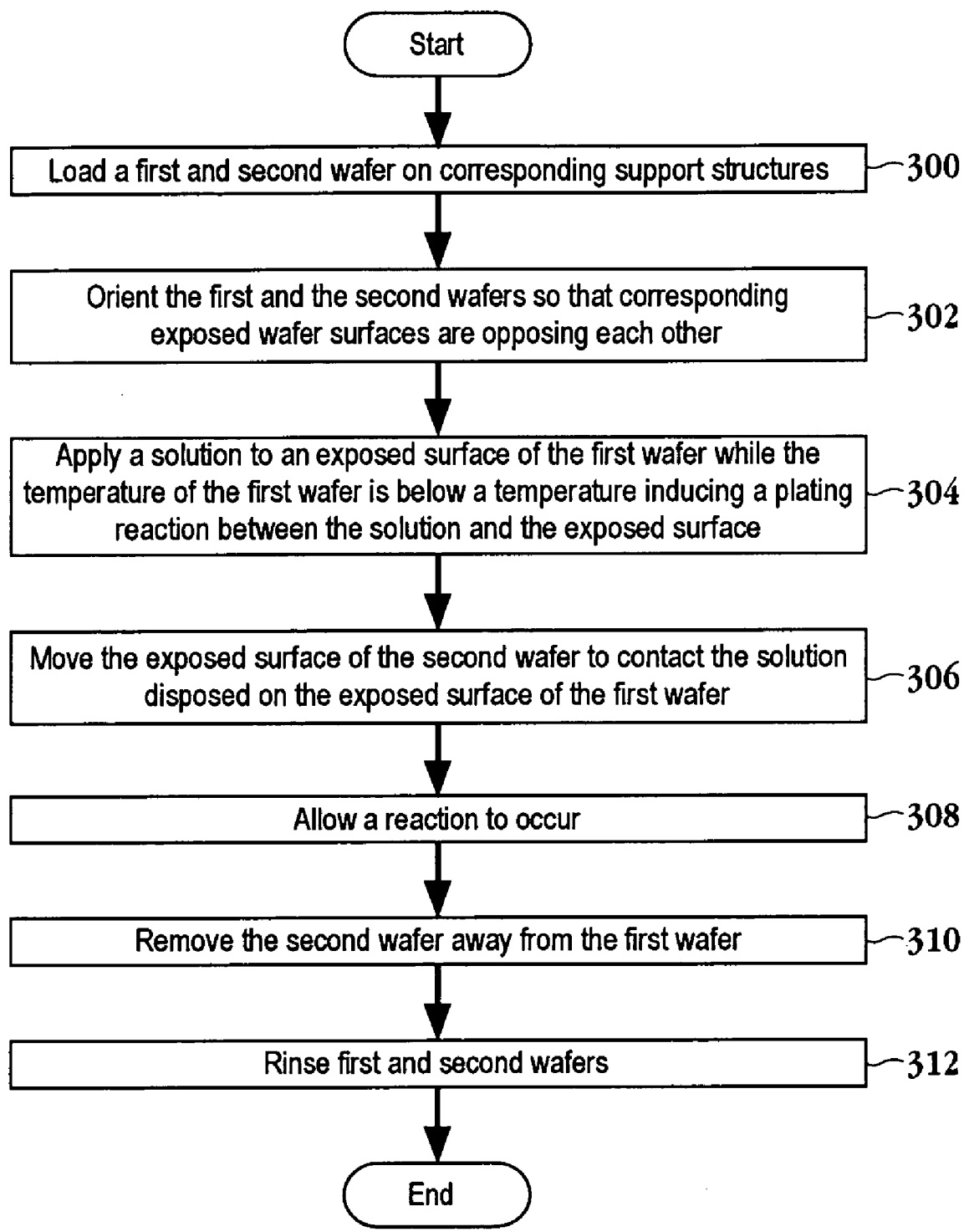
FIG. 4 is a flow chart diagram illustrating the method operations for performing a plating technique to increase throughput in accordance with one embodiment of the invention.

FIG. 4 is a flow chart diagram illustrating the method operations for performing a plating technique to increase throughput in accordance with one embodiment of the invention. The method initiates with operation 300 where first and second wafers are loaded onto corresponding support structures. In one embodiment, the support structures are heated vacuum chucks as depicted above. The method then moves to operation 302 where the first and second wafers are oriented so that corresponding exposed wafer surfaces are opposing each other. Here, one wafer chuck may be inverted over another wafer chuck as illustrated in FIGS. 2A-D. In one embodiment, the vacuum chucks may have a slight convex curvature on the surface which the wafer sits. This convex curvature is imparted to the wafer to improve distribution of the electrolyte over the wafer surface and minimize bubble formation. The method then advances to operation 304 where a solution is applied to an exposed surface of a first wafer, while the temperature of the first wafer is below a temperature inducing a plating reaction between the solution and the exposed surface. In one embodiment, the solution is an electrolyte solution for an electroless plating reaction that occurs at an elevated temperature, e.g., a cobalt plating solution. In another embodiment, the solution may be applied where a reducing agent is added at a point of use in order to enhance the stability of the process. The method then proceeds to operation 306 where the exposed surface of the second wafer is moved to contact the solution disposed on the exposed surface of the first wafer. It should be appreciated that as this is taking place, contemporaneously the wafers are being heated through the corresponding vacuum chucks. In one embodiment, the temperature of the top wafer is at an elevated temperature as relative to the temperature of the bottom wafer as discussed with regard to FIG. 3. Once the temperature of the plating solution disposed in the gap between the two wafers is above a threshold plating temperature, the electroless plating will begin. Thus, in operation 308 the reaction occurs for a specified period of time. The method then moves to operation 310 where the second wafer is moved away from the first wafer. Alternatively, both wafers may be removed from each other, according to drives attached to the corresponding vacuum chucks. In operation 312, the first and second wafers are rinsed, or quenched in order to remove any remaining fluid or contaminates. The wafers are then available for further processing that may take place downstream. As mentioned above, the amount of electrolyte solution deposited on the surface of the wafer may be self-limiting.

Although a few embodiments of the present invention have been described in detail herein, it should be understood, by those of ordinary skill, that the present invention may be embodied in many other specific forms without departing from the spirit or scope of the invention. Therefore, the present examples and embodiments are to be considered as illustrative and not restrictive, and the invention is not to be limited to the details provided therein, but may be modified and practiced within the scope of the appended claims.

What is claimed is:

1. A method for electroless plating on a semiconductor substrate, comprising method operations of:
    loading first and second semiconductor substrates onto corresponding first and second support structures;
    orienting first and second support structures so that corresponding exposed semiconductor substrate surfaces are opposing each other;
    then applying a plating solution to an exposed surface of the first semiconductor substrate;
    then bringing an exposed surface of the second semiconductor substrate into contact with the plating solution on the exposed surface of the first semiconductor substrate by moving the first semiconductor substrate and the second semiconductor substrate closer together;
    then initiating an electroless plating reaction between the plating solution and both exposed surfaces to provide electroless plating on both exposed surfaces; and
    then moving the exposed surfaces away from each other.

2. The method of claim 1, wherein the method operation of applying a plating solution to an exposed surface of the first semiconductor substrate includes, heating the exposed surface of the first semiconductor substrate to a temperature below a temperature inducing an electroless plating reaction prior to applying the plating solution.

3. The method of claim 1, wherein the method operation of bringing an exposed surface of the second semiconductor substrate into contact with the plating solution on the exposed surface of the first semiconductor substrate includes, heating the exposed surface of the first semiconductor substrate to a temperature above a temperature inducing an electroless plating reaction prior to bringing the exposed surface of the second semiconductor substrate into contact with the plating solution.

4. The method of claim 1, wherein the method operation of initiating a plating reaction between the plating solution and both exposed surfaces includes, heating the plating solution to a temperature inducing an electroless plating reaction by applying heat from the first and second support structures.

5. The method of claim 1, wherein the method operation of bringing an exposed surface of the second semiconductor substrate into contact with the plating solution on the exposed surface of the first semiconductor substrate includes, defining a gap of between about 50 μm and about 1000 μgm between the exposed semiconductor substrate surfaces.

6. The method of claim 1, further comprising:
rinsing the exposed surfaces; and
drying the rinsed surfaces.

7. The method of claim 1, wherein the method operation of applying a plating solution to an exposed surface of the first semiconductor substrate includes, delivering an amount of plating solution between about 2 mL and about 5 mL, wherein the plating solution is a cobalt based plating solution.

8. The method of claim 1, wherein the method operation of applying the plating solution to an exposed surface of the first semiconductor substrate includes, adding a reducing agent portion of the plating solution to a remaining portion of the plating solution at a point of use of the plating solution, wherein the reducing agent portion and the remaining portion are maintained at a temperature below a temperature inducing an electroless plating reaction.

* * * * *